United States Patent
Ryou et al.

(10) Patent No.: US 8,012,821 B2
(45) Date of Patent: Sep. 6, 2011

(54) SEMICONDUCTOR EMBEDDED RESISTOR GENERATION

(75) Inventors: Choongryul Ryou, Seongnam-si (KR); Seunghwan Lee, Fishkill, NY (US); Jun Yuan, Fishkill, NY (US); Victor Chan, Newburgh, NY (US); Manfred Eller, Beacon, NY (US); Nam Sung Kim, Beacon, NY (US); Narasimhulu Kanike, Wappingers Falls, NY (US); Srikanth Balaji Samavedam, Fishkill, NY (US)

(73) Assignee: Samsung Electronics Co., Ltd., Suwon-Si (KR)

( * ) Notice: Subject to any disclaimer, the term of this patent is extended or adjusted under 35 U.S.C. 154(b) by 180 days.

(21) Appl. No.: 12/364,764

(22) Filed: Feb. 3, 2009

(65) Prior Publication Data

US 2010/0197106 A1    Aug. 5, 2010

(51) Int. Cl.
*H01L 21/8238* (2006.01)
(52) U.S. Cl. .................. 438/210; 438/238; 438/382
(58) Field of Classification Search .................. 438/210, 438/238, 381, 382
See application file for complete search history.

(56) References Cited

U.S. PATENT DOCUMENTS

| | | | | |
|---|---|---|---|---|
| 5,304,502 A | * | 4/1994 | Hanagasaki | .................. 438/210 |
| 5,716,863 A | | 2/1998 | Arai | |
| 6,083,785 A | * | 7/2000 | Segawa et al. | ................ 438/238 |
| 6,406,956 B1 | | 6/2002 | Tsai et al. | |
| 6,436,747 B1 | * | 8/2002 | Segawa et al. | ................ 438/197 |
| 7,795,100 B2 | * | 9/2010 | Ema et al. | ..................... 438/301 |
| 2002/0033519 A1 | * | 3/2002 | Babcock et al. | ............. 257/536 |
| 2003/0155621 A1 | * | 8/2003 | Moriwaki et al. | ............. 257/412 |
| 2005/0227440 A1 | * | 10/2005 | Ema et al. | ..................... 438/275 |
| 2006/0022276 A1 | * | 2/2006 | Park et al. | ..................... 257/368 |

FOREIGN PATENT DOCUMENTS

KR      1020050069626       7/2005

OTHER PUBLICATIONS

Kuo et al., "A 32-Bit RISC Microcontroller with 448K Bytes of Embedded Flash Memory", 1998 Int'l NonVolatile Memory Technology Conference, pp. 28-33.

* cited by examiner

*Primary Examiner* — Matthew Smith
*Assistant Examiner* — John M Parker
(74) *Attorney, Agent, or Firm* — F. Chau & Associates, LLC

(57) ABSTRACT

Generating an embedded resistor in a semiconductor device includes forming a shallow trench isolation (STI) region in a substrate; forming a pad oxide on the STI region and substrate; depositing a silicon layer on the pad oxide; forming a photo-resist mask on a portion of the silicon layer disposed above the STI region; etching the silicon layer to yield a polyconductor above the STI region; oxidizing the polyconductor; depositing an oxide material or a metal gate material on the oxidized surface; depositing a silicon layer on the oxide material or metal gate material; depositing additional silicon on a portion of the silicon layer above the STI region; patterning a transistor gate with a photo-resist mask on another portion of the silicon layer away from the STI region; and etching the silicon layer to yield a transistor structure away from the STI region and a resistor structure above the STI region.

21 Claims, 27 Drawing Sheets

SEMICONDUCTOR EMBEDDED RESISTOR GENERATION

BACKGROUND OF THE INVENTION

The present disclosure generally relates to semiconductor integrated circuits. More particularly, the present disclosure relates to the generation of embedded resistors in semiconductor integrated circuits.

Semiconductor integrated circuits may include various types of embedded resistors. An OP type of resistor is formed by adding implants to a polyconductor (PC) or active region (RX) of an integrated circuit. Embedded resistors may include well types (e.g., N-Well), OP RX types (e.g., OP N+ Diffusion), and/or OP PC types (e.g., OP P+ PolySilicon). OP resistors are relatively inexpensive to generate because they use implants and process parameters already in use for other components, such as transistors, in the semiconductor integrated circuits.

SUMMARY OF THE INVENTION

These and other issues are addressed by methods for generating embedded resistors in semiconductor devices. Exemplary embodiments are provided.

An exemplary embodiment method for generating an embedded resistor in a semiconductor device includes forming a shallow trench isolation (STI) region in a substrate; forming a pad oxide on the STI region and substrate; depositing a silicon layer on the pad oxide; forming a photo-resist mask on a portion of the silicon layer disposed substantially above the STI region; etching the silicon layer to yield a polyconductor (PC) disposed substantially above the STI region; oxidizing the PC; depositing at least one of an oxide material or a metal gate material on the oxidized surface; depositing a silicon layer on the at least one oxide material or metal gate material; depositing additional silicon on a portion of the silicon layer disposed substantially above the STI region; patterning a transistor gate with a photo-resist mask disposed on another portion of the silicon layer disposed substantially away from the STI region; and etching the silicon layer to yield at least one transistor structure disposed substantially away from the STI region and at least one resistor structure disposed substantially above the STI region.

In a preferred embodiment, the silicon comprises polycrystalline silicon (Poly-Si), the oxide material comprises Hafnium Oxide (HfO2), and the metal gate material comprises Titanium Nitride (TiN). In an eFUSE embodiment, the method further includes forming a silicide portion on at least one of the transistor or resistor structures. The step of forming a photo-resist mask on a portion of the silicon layer disposed substantially above the STI region is the only photo step added for forming a resistor structure. In a High-K Metal Gate (HKMG) embodiment, the step of depositing at least one of an oxide material or a metal gate material on the oxidized surface comprises depositing a High-K material and a metal gate material. The High-K material may comprise at least one of HfO2, AlO, ZrO2, TiO2, or like materials; and the metal gate material may comprise TiN, or like materials.

In a computer-readable storage medium embodiment, the program steps for generating an embedded resistor in a semiconductor device include forming an STI region in a substrate; forming a pad oxide on the STI region and substrate; depositing a silicon layer on the pad oxide; forming a photo-resist mask on a portion of the silicon layer disposed substantially above the STI region; etching the silicon layer to yield a PC disposed substantially above the STI region; oxidizing the PC; depositing at least one of an oxide material or a metal gate material on the oxidized surface; depositing a silicon layer on the at least one oxide material or metal gate material; depositing additional silicon on a portion of the silicon layer disposed substantially above the STI region; patterning a transistor gate with a photo-resist mask disposed on another portion of the silicon layer disposed substantially away from the STI region; and etching the silicon layer to yield at least one transistor structure disposed substantially away from the STI region and at least one resistor structure disposed substantially above the STI region.

The present disclosure will be further understood from the following description of exemplary embodiments, which is to be read in connection with the accompanying drawings.

BRIEF DESCRIPTION OF THE DRAWINGS

The present disclosure provides methods for generating semiconductor embedded resistors in accordance with the following exemplary figures, in which.

DETAILED DESCRIPTION OF PREFERRED EMBODIMENTS

Exemplary methods are provided for generating semiconductor embedded resistors. An OP type of resistor is formed by adding implants to a polyconductor (PC) or active region (RX) of an integrated circuit. Exemplary embodiment methods yield OP PC resistors, such as OP P+ Polycrystalline Silicon (PolySilicon or Poly-Si) types, that are particularly useful in bandgap reference circuits due to their negative temperature coefficient characteristics. Method embodiments use fewer photolithography steps for generating such resistors, and generally reduce oxide damage versus prior methods.

Shallow trench isolation (STI) is a feature of integrated circuits that acts to prevent electrical current leakage between adjacent semiconductor device components. STI may be used with CMOS process technology nodes that are less than about 250 nanometers, for example. STI is created early during the semiconductor device fabrication process, before the resistors or transistors are formed. A typical STI process involves etching a pattern of trenches in the silicon, depositing one or more dielectric materials, such as silicon dioxide (SiO2), to fill the trenches, and removing the excess dielectric, such as by planarization.

In exemplary OP PC resistors, the resistance decreases with increasing temperature. Therefore, for PolySilicon resistor types, double-gate (DG) structures use a thicker oxide, extended-gate (EG) structures use a middle-thickness oxide, and single-gate (SG) structures use a thinner oxide. For example, SG may be used for the core device while EG and DG may be used for interfaces. OP P+ resistors are preferred for use in bandgap reference circuits due to their negative temperature coefficient characteristics.

Figure 1:
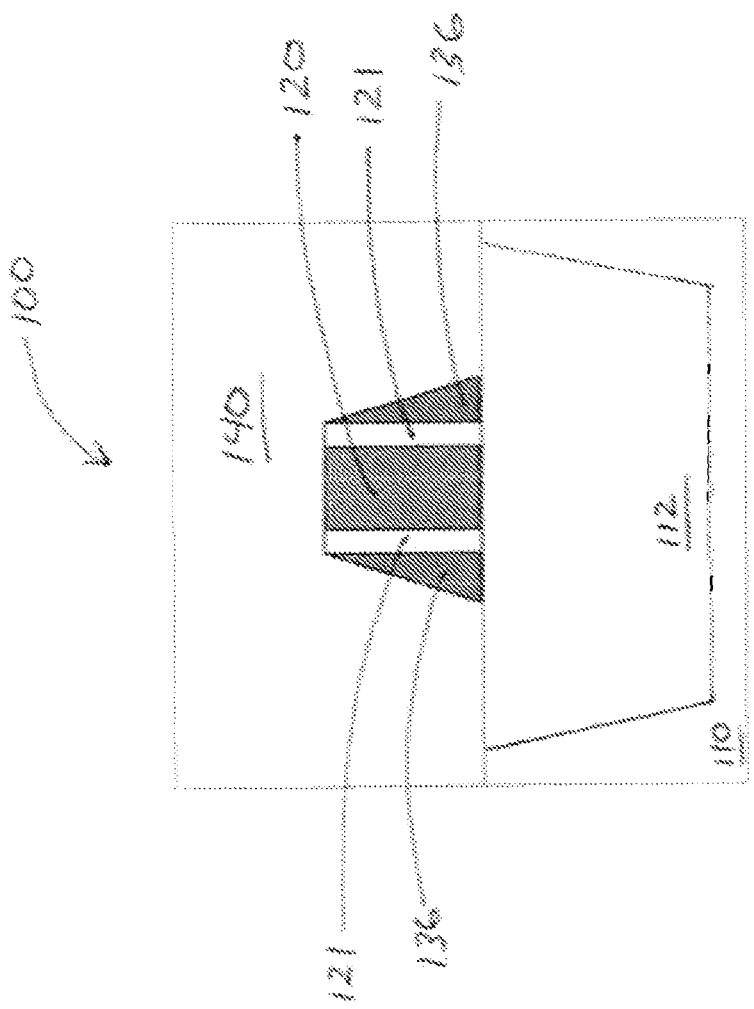
FIG. 1 shows a schematic vertical side view of an OP polyconductor (PC) resistor structure.

As shown in FIG. 1, an OP polyconductor (PC) resistor is indicated generally by the reference numeral 100. The resistor 100 includes a substrate 110, a shallow trench isolation (STI) portion 112 disposed on the substrate, a polyconductor (PC) portion 120 disposed on the STI, a side insulator 121 disposed on the STI around the PC, a spacer 136 disposed on the STI around the side insulator, and a top insulator 140 disposed over the substrate, STI, spacer, side insulator, and PC portions.

Figure 2:
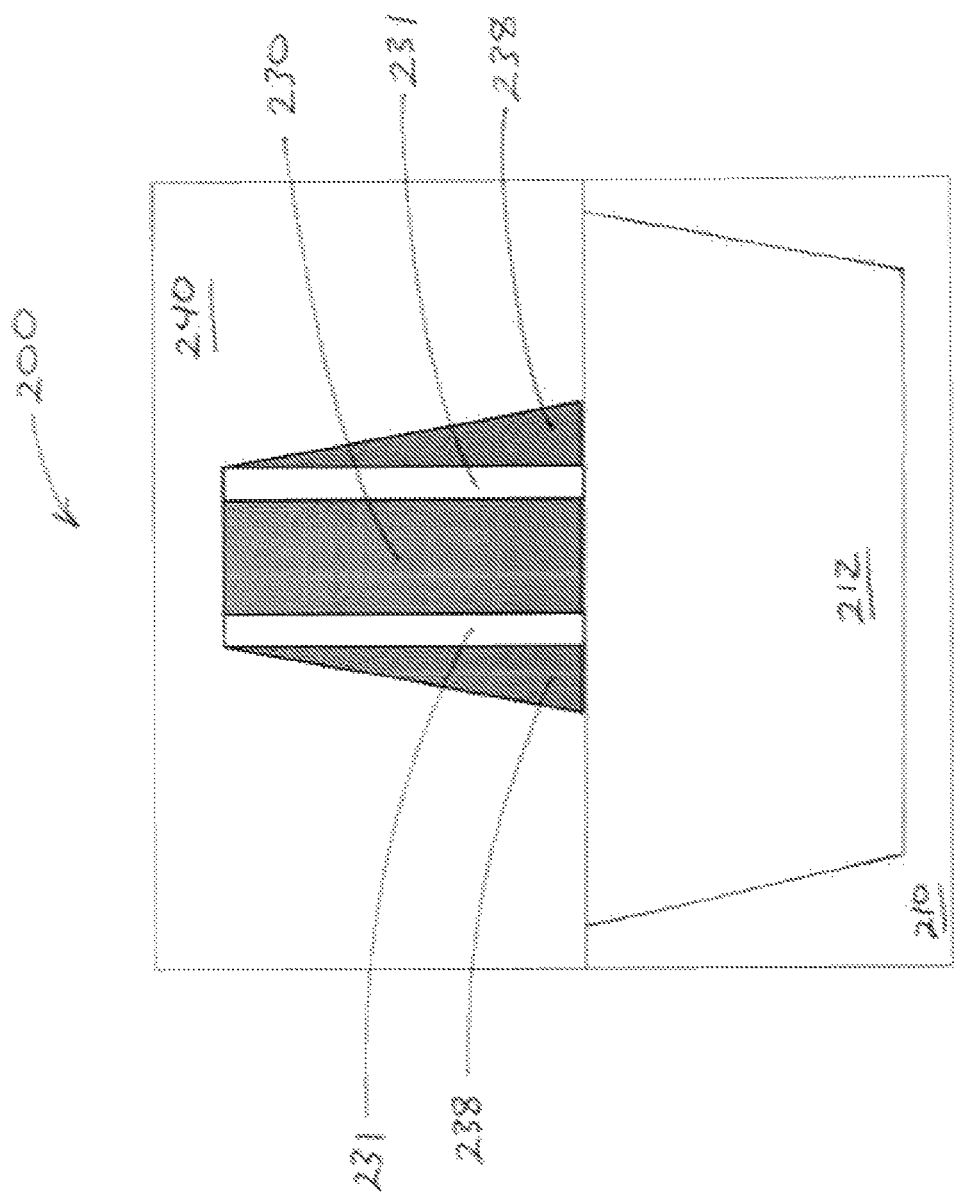
FIG. 2 shows a schematic vertical side view of an OP Polycrystalline Silicon (Poly-Si) resistor structure.

Turning to FIG. 2, a PolySilicon OP PC resistor is indicated generally by the reference numeral 200. The resistor 200 includes a silicon (Si) substrate 210, a shallow trench isolation (STI) portion 212 disposed on the substrate, a Poly-Si portion 230 disposed on the STI, a side insulator 231 disposed on the STI around the Poly-Si, a spacer 238 disposed on the STI around the side insulator, and a top insulator 240 disposed over the Si substrate, STI, spacer, side insulator, and Poly-Si portions.

Figure 3:
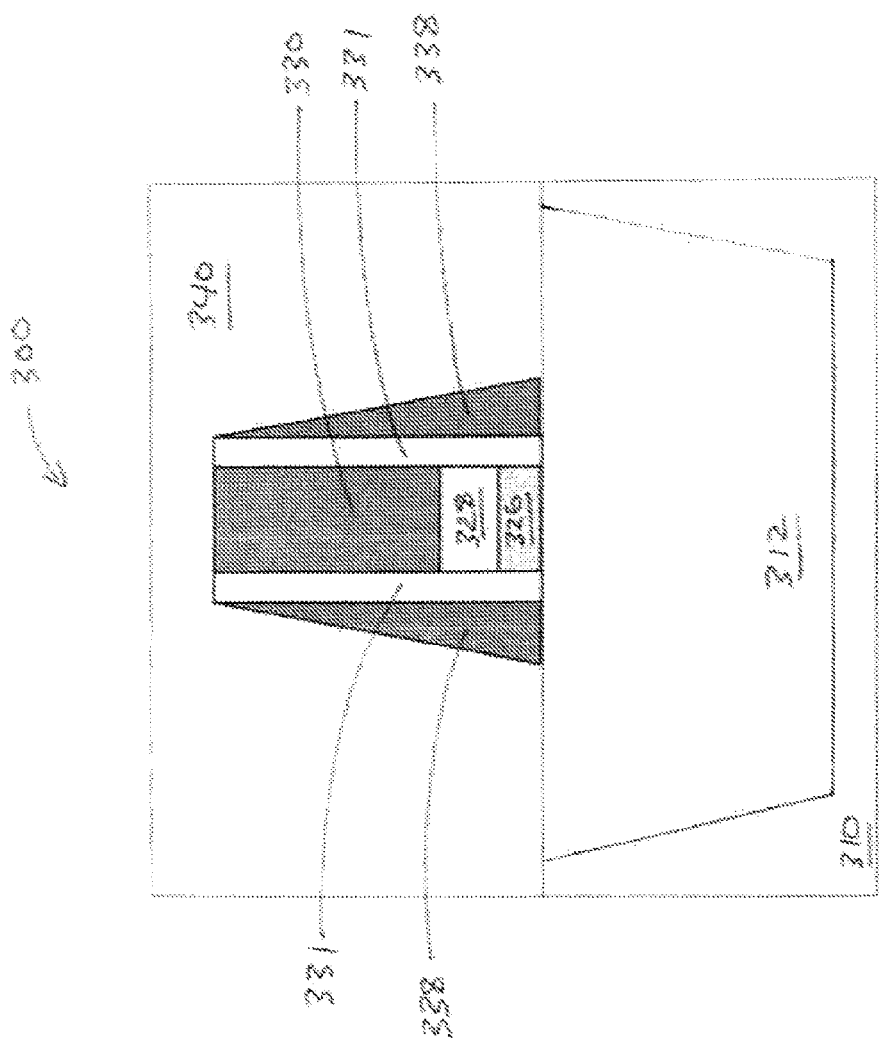
FIG. 3 shows a schematic vertical side view of a High-K Metal Gate (HK/MG)

Turning now to FIG. 3, a High-K Metal Gate (HK/MG) resistor is indicated generally by the reference numeral 300. The resistor 300 includes a silicon (Si) substrate 310, an STI portion 312 disposed on the substrate, a (HfO2) portion 326 disposed on the STI, a (TiN) portion disposed on the HfO2, a Poly-Si portion 330 disposed on the TiN, a side insulator 331 disposed on the STI around the Poly-Si, a spacer 338 disposed on the STI around the side insulator, and a top insulator 340 disposed over the Si substrate, STI, spacer, side insulator, and Poly-Si portions. Unfortunately, high resistance may prove hard to implement in the HK/MG resistor 300 due to the low and non-linear resistance characteristics of the inserted metal layer 328.

Figure 4:
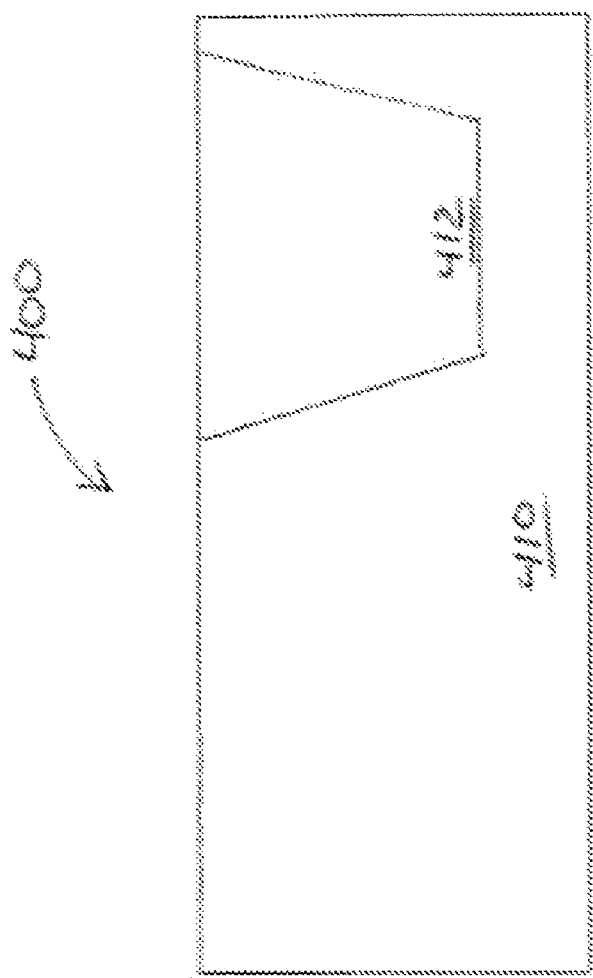
FIG. 4 shows a schematic vertical side view of an OP resistor structure after shallow trench isolation (STI) formation in accordance with an exemplary embodiment of the present disclosure.

As shown in FIG. 4, an exemplary embodiment OP resistor structure after STI formation is indicated generally by the reference numeral 400. Here, the structure 400 includes an elongated substrate 410, and an STI portion 412 disposed on the substrate substantially towards one end of the elongated substrate, leaving another end of the substrate without STI disposed thereon. The STI formation process defines the isolation region or portion.

Figure 5:
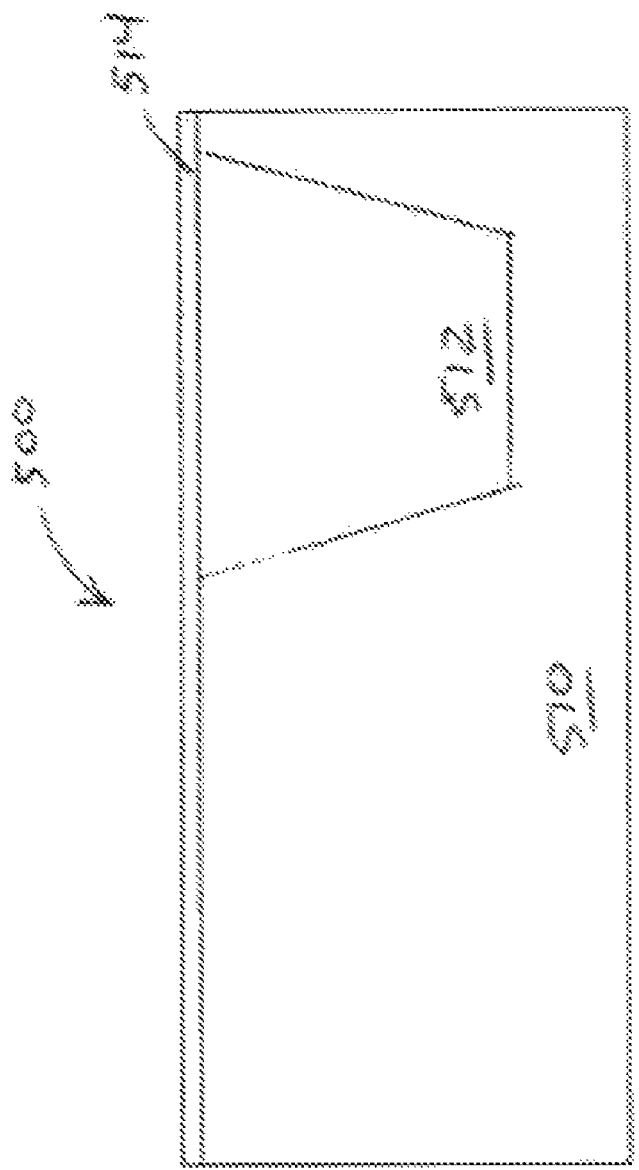
FIG. 5 shows a schematic vertical side view of an OP resistor structure after pad oxidation and well ion-implantation (IIP) in accordance with an exemplary embodiment of the present disclosure.

Turning to FIG. 5, an exemplary embodiment OP resistor structure after pad oxidation and well ion-implantation (IIP) is indicated generally by the reference numeral 500. The structure 500 is similar to the structure 400 of FIG. 4, so duplicate description may be omitted. Here, an oxidation layer 514 is disposed over the substrate 510 and STI 512. The pad oxide is formed by an oxidation process, and channel IIP, such as Vt Taylor, may be applied.

Figure 6:
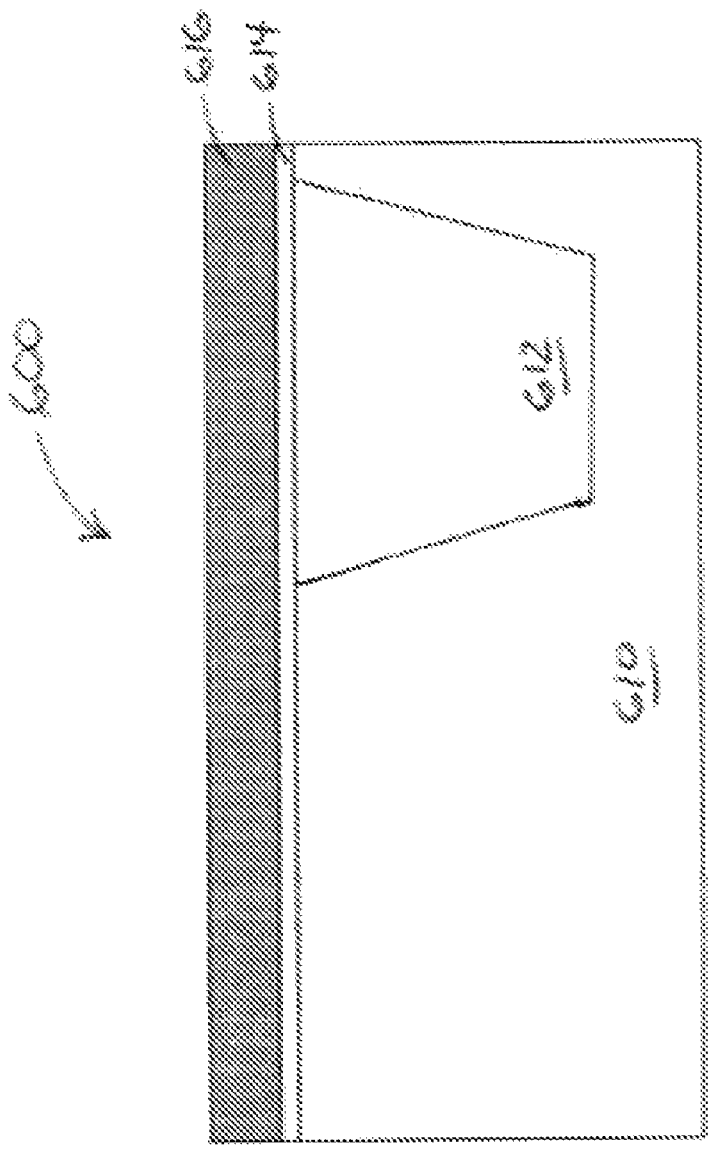
FIG. 6 shows a schematic vertical side view of an OP resistor structure after Poly-Si deposition in accordance with an exemplary embodiment of the present disclosure.

Turning now to FIG. 6, an exemplary embodiment OP resistor structure after Poly-Si deposition is indicated generally by the reference numeral 600. The structure 600 is similar to the structure 500 of FIG. 5, so duplicate description may be omitted. Here, a Poly-Si layer 616 is disposed over the oxidation layer 614. The Poly-Si is deposited in order to form an OP resistor and/or eFUSE. The Poly-Si thickness can be between about 0 Angstroms and about 2000 Angstroms, for example.

Figure 7:
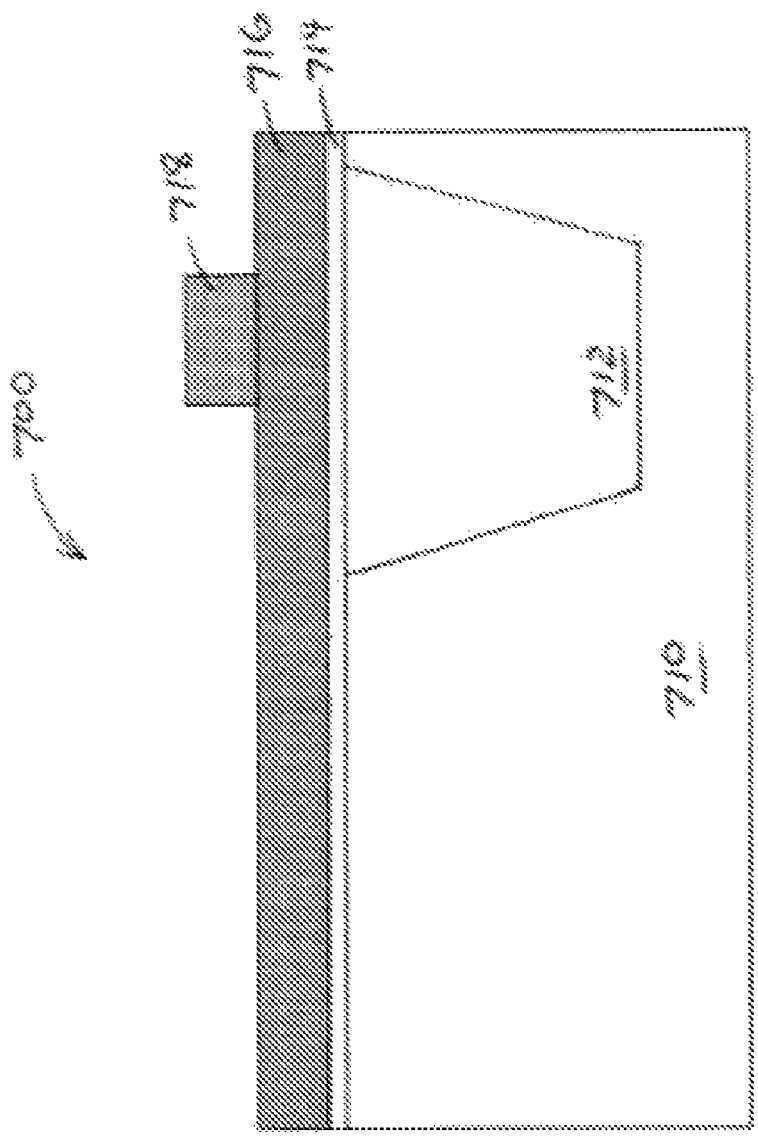
FIG. 7 shows a schematic vertical side view of an OP resistor structure after OP PC resistor patterning in accordance with an exemplary embodiment of the present disclosure.

As shown in FIG. 7, an exemplary embodiment OP resistor structure after OP PC resistor patterning is indicated generally by the reference numeral 700. The structure 700 is similar to the structure 600 of FIG. 6, so duplicate description may be omitted. Here, a photo-resist (PR) pattern 718 is disposed on the Poly-Si layer 716.

Figure 8:
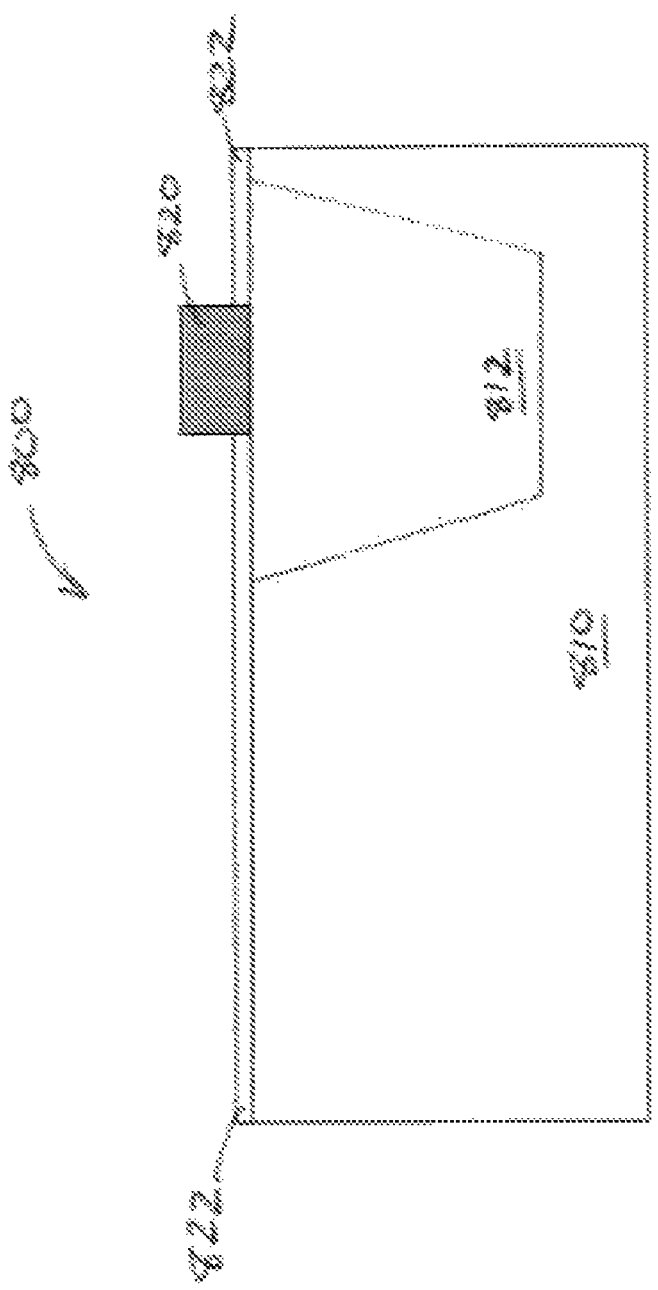
FIG. 8 shows a schematic vertical side view of an OP resistor structure after OP PC etch in accordance with an exemplary embodiment of the present disclosure.

Turning to FIG. 8, an exemplary embodiment OP resistor structure after OP PC etch is indicated generally by the reference numeral 800. The structure 800 is similar to the structure 700 of FIG. 7, so duplicate description may be omitted. After etching, a polyconductor (PC) 820 portion of the former Poly-Si layer is disposed on the STI 812, and a residual layer 822 is disposed over the remainder of the STI 812 and substrate 810.

Figure 9:
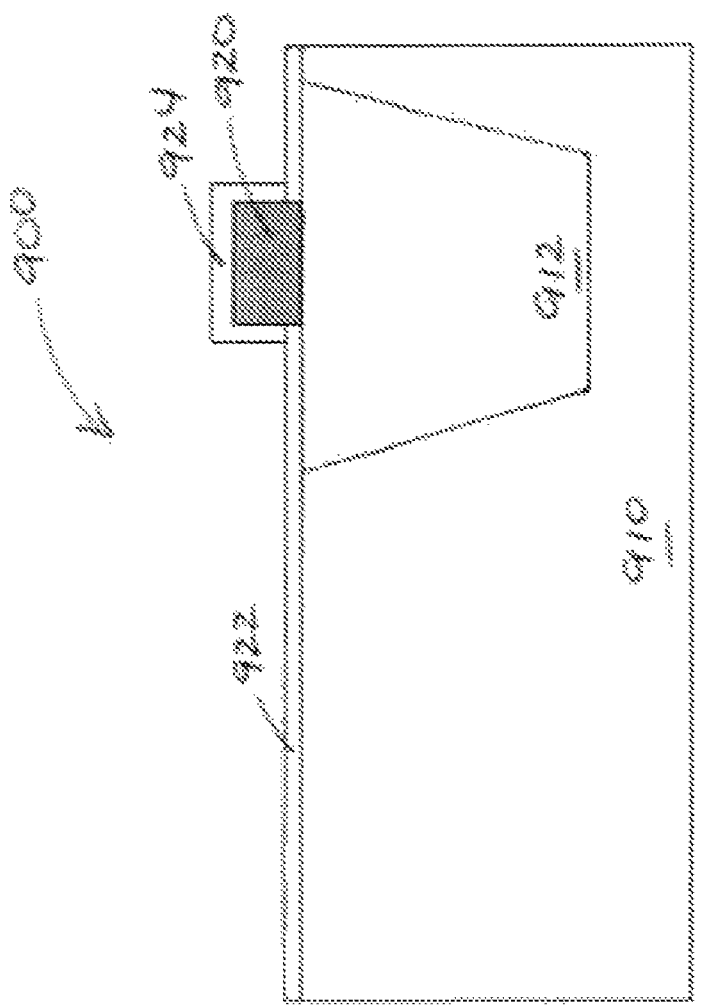
FIG. 9 shows a schematic vertical side view of an OP resistor structure after double-gate (DG) and extended-gate (EG) oxidation in accordance with an exemplary embodiment of the present disclosure.

Turning now to FIG. 9, an exemplary embodiment OP resistor structure after double-gate (DG) and extended-gate (EG) oxidation is indicated generally by the reference numeral 900. The structure 900 is similar to the structure 800 of FIG. 8, so duplicate description may be omitted. Here, an EG oxide 922 is disposed over the exposed portion of the STI 912 and the substrate 910, and a DG oxide 924 is disposed over the PC 920.

In alternate embodiments, the oxidation process at this step can include single gate (SG) oxide, dual gate (DG) oxide, triple gate (TG) oxide, quadruple, and higher number of oxide processes. Thus, various oxidation processes may follow after poly patterning, and the present disclosure is not limited to DG, EG and SG, for example.

Figure 10:
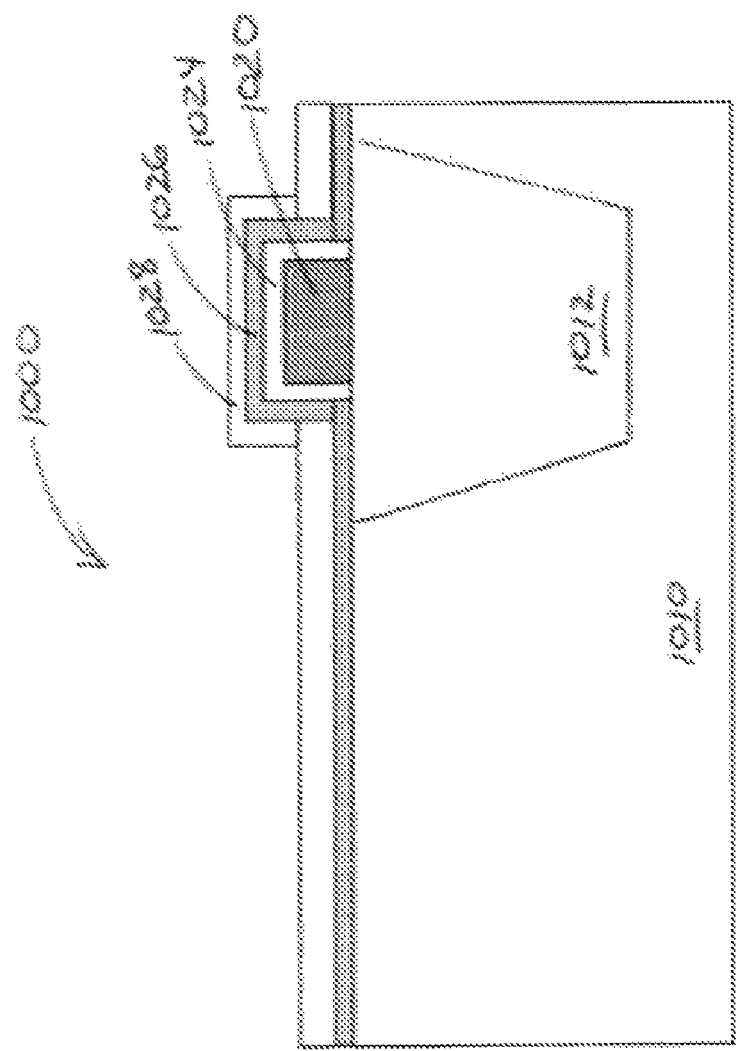
FIG. 10 shows a schematic vertical side view of an OP resistor structure after Hafnium Oxide (HfO2) and Titanium Nitride (TiN) deposition in accordance with an exemplary embodiment of the present disclosure.

As shown in FIG. 10, an exemplary embodiment OP resistor structure after Hafnium Oxide (HfO2) and Titanium Nitride (TiN) deposition is indicated generally by the reference numeral 1000. The structure 1000 is similar to the structure 900 of FIG. 9, so duplicate description may be omitted. Here, a Hafnium Oxide (HfO2) layer 1026 is disposed over the exposed portion of the STI 1012 and the substrate 1010, and over the DG oxide 1024 on the PC 1020. In addition, a Titanium Nitride (TiN) layer 1028 is disposed over the HfO2 layer. The thickness of the TiN 1028 substantially above the PC 1020 and DG 1024 may be thinner than the thickness of the TiN elsewhere For example, the thickness of the TiN 1028 substantially above the PC 1020, plus the thickness of the DG 1024 above the PC 1020, may approximate the thickness of the TiN elsewhere.

In alternate embodiments, the high-K material may include HfO2, AlO, ZrO2, TiO2, and the like. In addition, oxide materials such as SiO2, SiON, DPN oxide, RPN oxide, and the like can also be used for gate oxide. Thus, the gate oxide is not limited to High-K. The metal gate material may be or include TiN or like materials.

Figure 11:
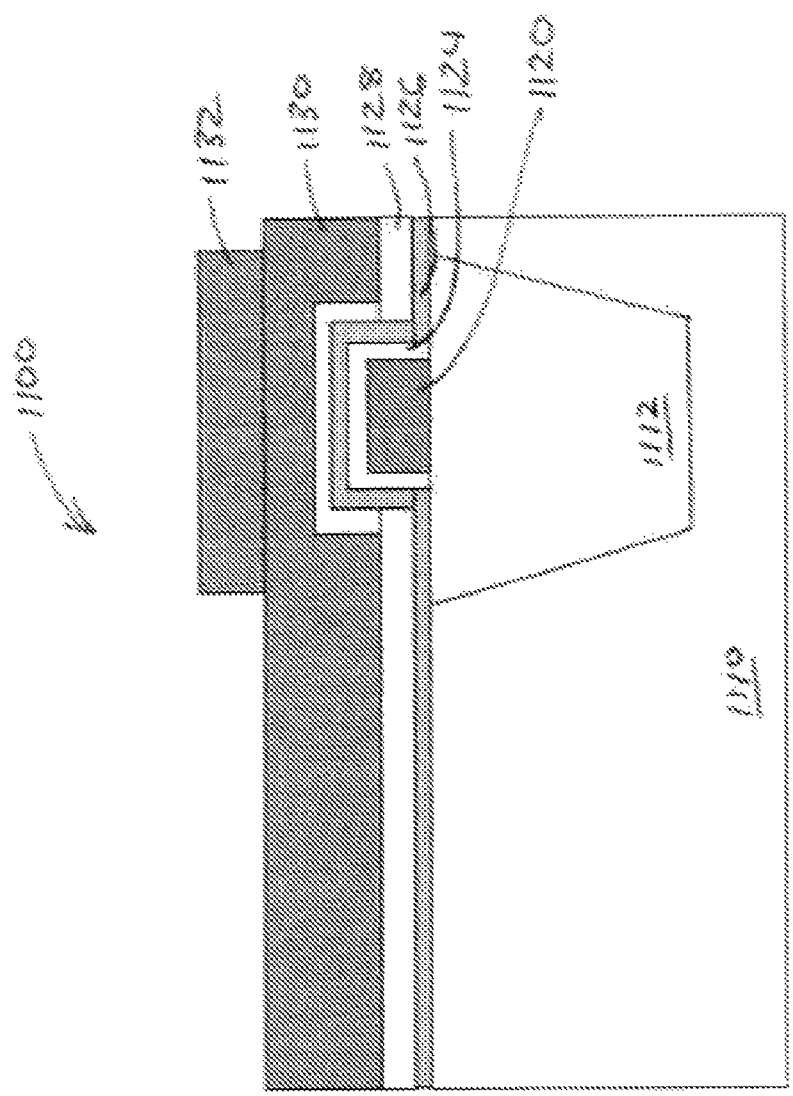
FIG. 11 shows a schematic vertical side view of an OP resistor structure after gate Poly-Si deposition in accordance with an exemplary embodiment of the present disclosure.

Turning to FIG. 11, an exemplary embodiment OP resistor structure after gate Poly-Si deposition is indicated generally by the reference numeral 1100. The structure 1100 is similar to the structure 1000 of FIG. 10, so duplicate description may be omitted. Here, a Poly-Si layer 1130 is disposed over the TiN layer 1128, and a gate Poly-Si portion 1132 is disposed on the Poly-Si 1130 substantially over the STI 1112. The thickness of the level-Poly-Si 1130 substantially above the PC 1120 may be thinner than the thickness of the Poly-Si elsewhere. For example, the thickness of the Poly-Si 1130 that is substantially above the PC 1120, plus the thickness of the gate Poly-Si 1132 above the PC 1120, may approximate the thickness of the Poly-Si 1130 elsewhere. Thus, the additional gate Poly-Si 1132 may be used to control the etch down to the PC 1120 while substantially preventing oxide damage thereon. Thus, additional Poly-Si may be deposited to form a High-K metal gate device.

Figure 12:
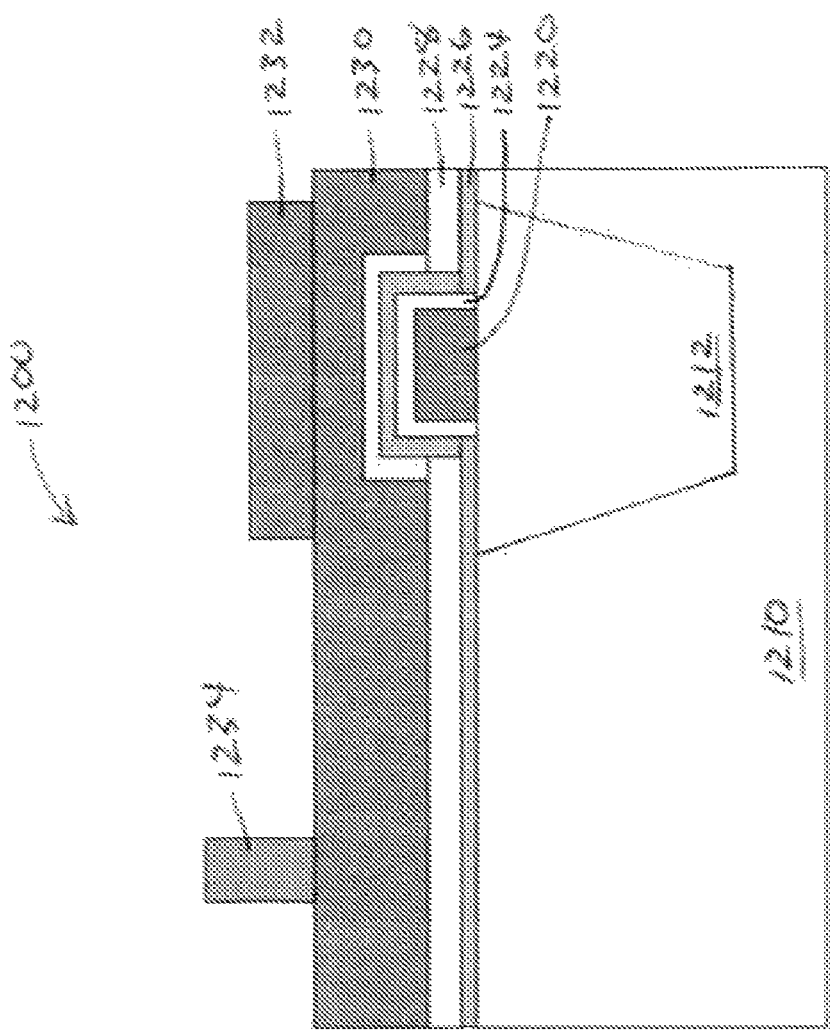
FIG. 12 shows a schematic vertical side view of an OP resistor structure after gate patterning in accordance with an exemplary embodiment of the present disclosure.

Turning now to FIG. 12, an exemplary embodiment OP resistor structure after gate patterning is indicated generally by the reference numeral 1200. The structure 1200 is similar to the structure 1100 of FIG. 11, so duplicate description may be omitted. Here, a photo-resist (PR) mask 1234 is disposed on the Poly-Si layer 1230 substantially towards the end of the elongated substrate without STI thereon.

Figure 13:
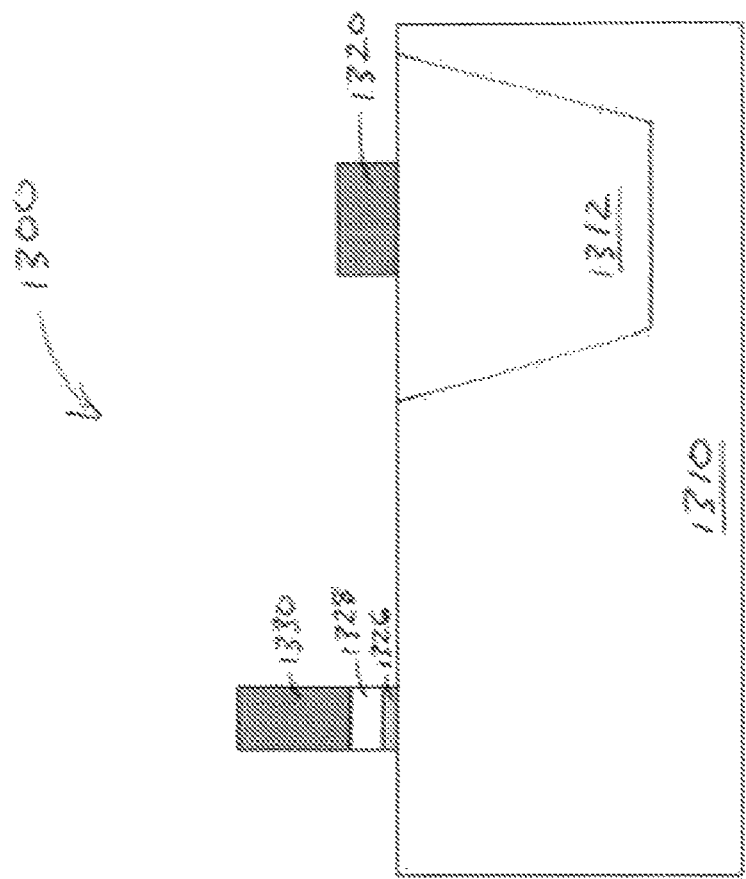
FIG. 13 shows a schematic vertical side view of an OP resistor structure after gate PC etching in accordance with an exemplary embodiment of the present disclosure.

As shown in FIG. 13, an exemplary embodiment OP resistor structure after gate PC etching is indicated generally by the reference numeral 1300. The structure 1300 is similar to the structure 1200 of FIG. 12, so duplicate description may be omitted. After etching, the PC 1320 remains on the STI 1312, while a columnar stack of the HfO2 1326, TiN 1328 and Poly-Si 1330 remains on the substrate 1310.

Figure 14:
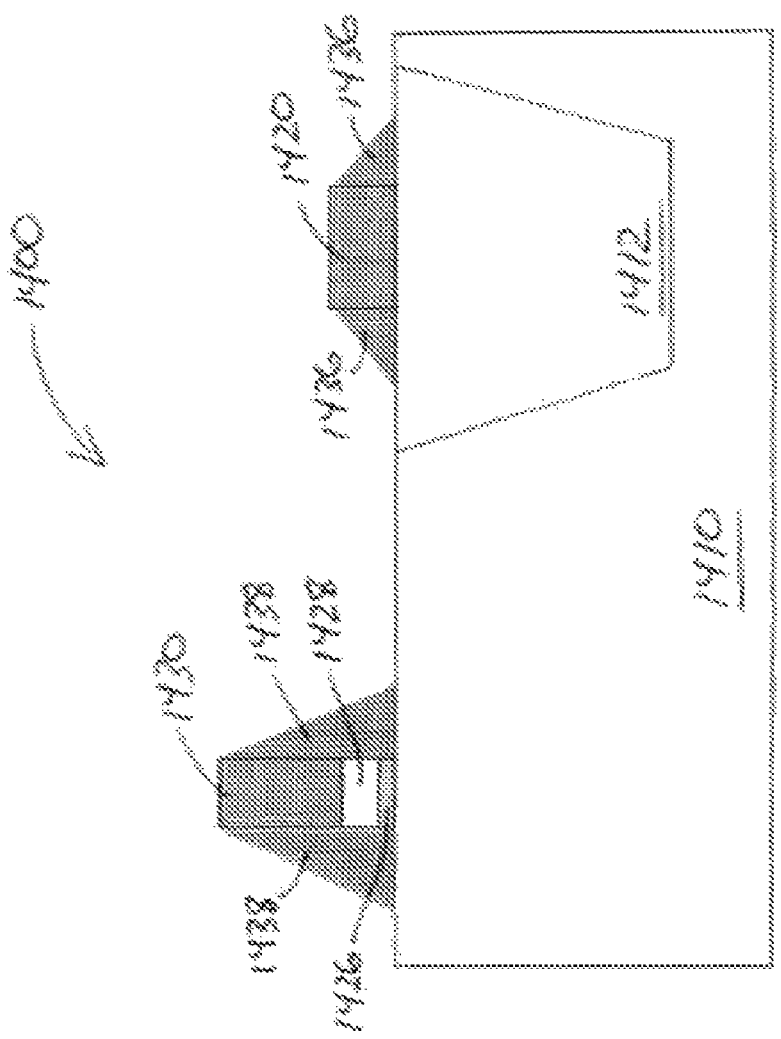
FIG. 14 shows a schematic vertical side view of an OP resistor structure after spacer formation in accordance with an exemplary embodiment of the present disclosure.

Turning to FIG. 14, an exemplary embodiment OP resistor structure after spacer formation is indicated generally by the reference numeral 1400. The structure 1400 is similar to the structure 1300 of FIG. 13, so duplicate description may be omitted. Here, a first spacer 1436 is disposed on the STI 1412 around the PC 1420, and a second spacer 1438 is disposed on the substrate 1410 around the columnar stack of the HfO2 1426, TiN 1428 and Poly-Si 1430.

Thus, patterning and formation of High-K metal gate devices may include formation of lightly doped drains (LDD), spacers and deep source/drain structures. A back-end-of-line (BEOL) process may be used, as may a middle-of-line (MOL) process, including silicide formation. MOL strip and clean processes form the contacts to the resistors and transistors after implantation, before metallization layers are added. This includes selective removal of un-reacted metallic films after the formation of self-aligned silicide on the source, drain and Poly-Silicon gate regions, as well as nitride spacer removal for optimization of strain enhancement and post contact-etch cleaning. BEOL strip and clean processes involve cleaning after dielectric etching to form the canals and vias that are later filled with diffusion barrier layers and metals. The cleaning step removes all etching and ash residue, including organic residues, oxidized metallic residues and particulate contamination, without attacking the patterned metal lines or dielectric, or causing physical damage to structures on the wafer surface.

Figure 15:
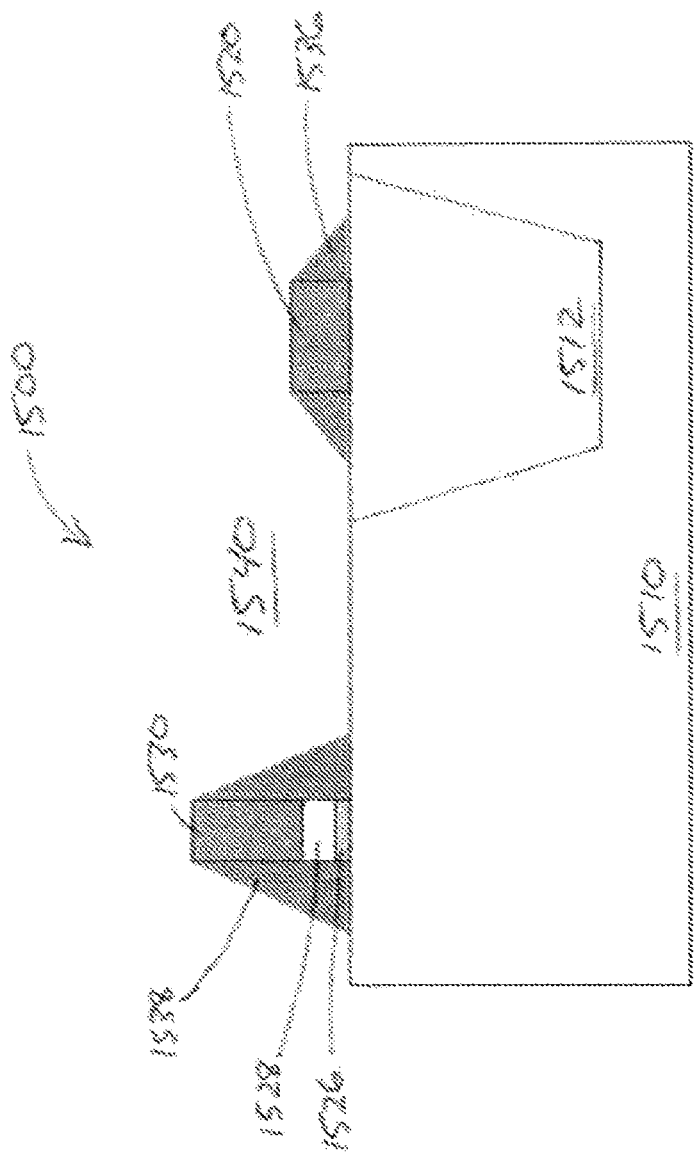
FIG. 15 shows a schematic vertical side view of an OP resistor final structure in accordance with an exemplary embodiment of the present disclosure.

Turning now to FIG. 15, an exemplary embodiment OP resistor final structure is indicated generally by the reference numeral 1500. The structure 1500 is similar to the structure 1400 of FIG. 14, so duplicate description may be omitted. Here, a leveling top insulator 1540 is disposed over the substrate 1510, second spacer 1538, Poly-Si 1530, first spacer 1536 and PC 1520. Thus, the insulated PC 1520 with first spacer 1536 forms an OP resistor. Simultaneously, the insulated columnar stack of Poly-Si 1530 disposed on TiN 1528, which is disposed on HfO2 1526, with second spacer 1538, forms a transistor.

Figure 16:
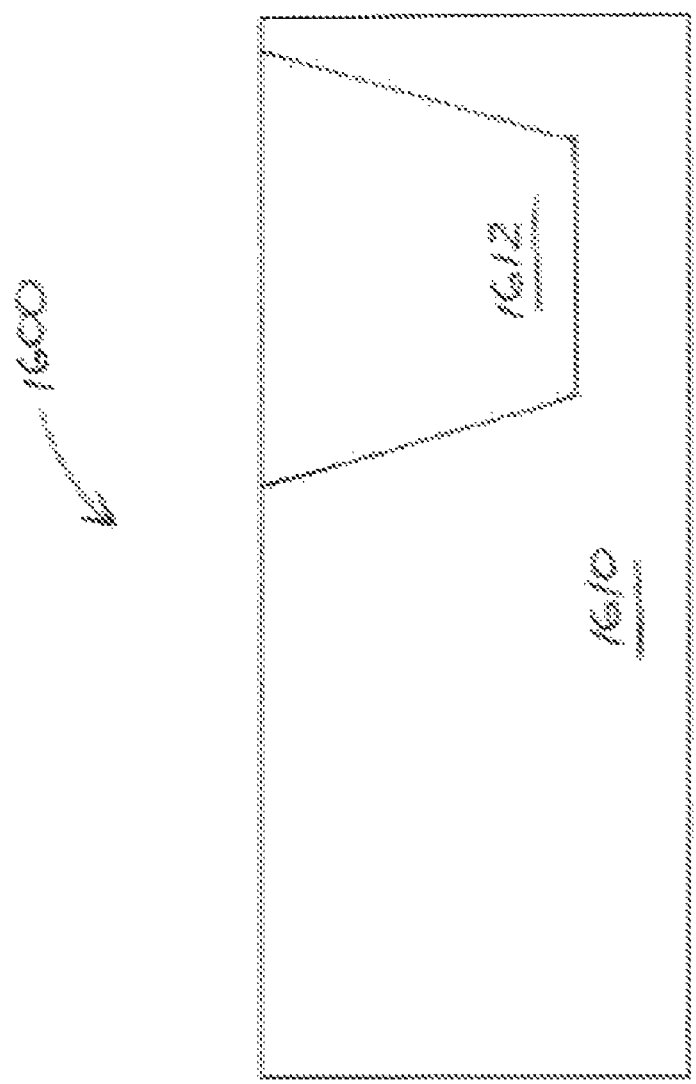
FIG. 16 shows a schematic vertical side view of an eFUSE structure after STI formation in accordance with an exemplary embodiment of the present disclosure.

As shown in FIG. 16, an exemplary embodiment eFUSE structure after STI formation is indicated generally by the reference numeral 1600. Here, the structure 1600 includes an elongated substrate 1610, and an STI portion 1612 disposed on the substrate substantially towards one end of the elongated substrate, leaving another end of the substrate without STI disposed thereon.

Figure 17:
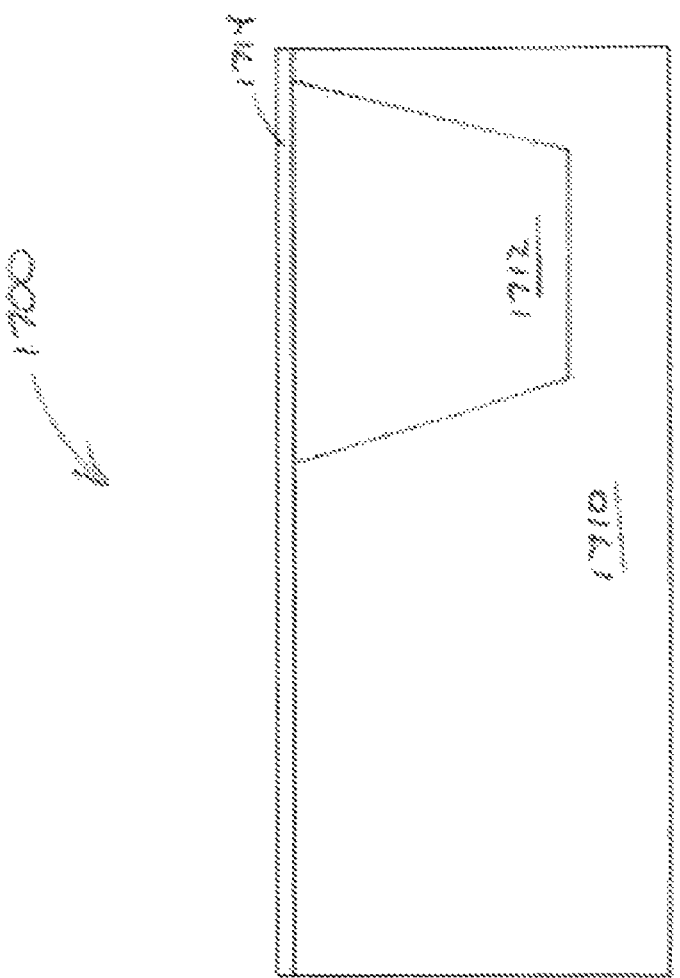
FIG. 17 shows a schematic vertical side view of an eFUSE structure after pad oxidation and well IIP in accordance with an exemplary embodiment of the present disclosure.

Turning to FIG. 17, an exemplary embodiment eFUSE structure after pad oxidation and well IIP is indicated generally by the reference numeral 1700. The structure 1700 is similar to the structure 1600 of FIG. 16, so duplicate description may be omitted. Here, an oxidation layer 1714 is disposed over the substrate 1710 and STI 1712.

Figure 18:
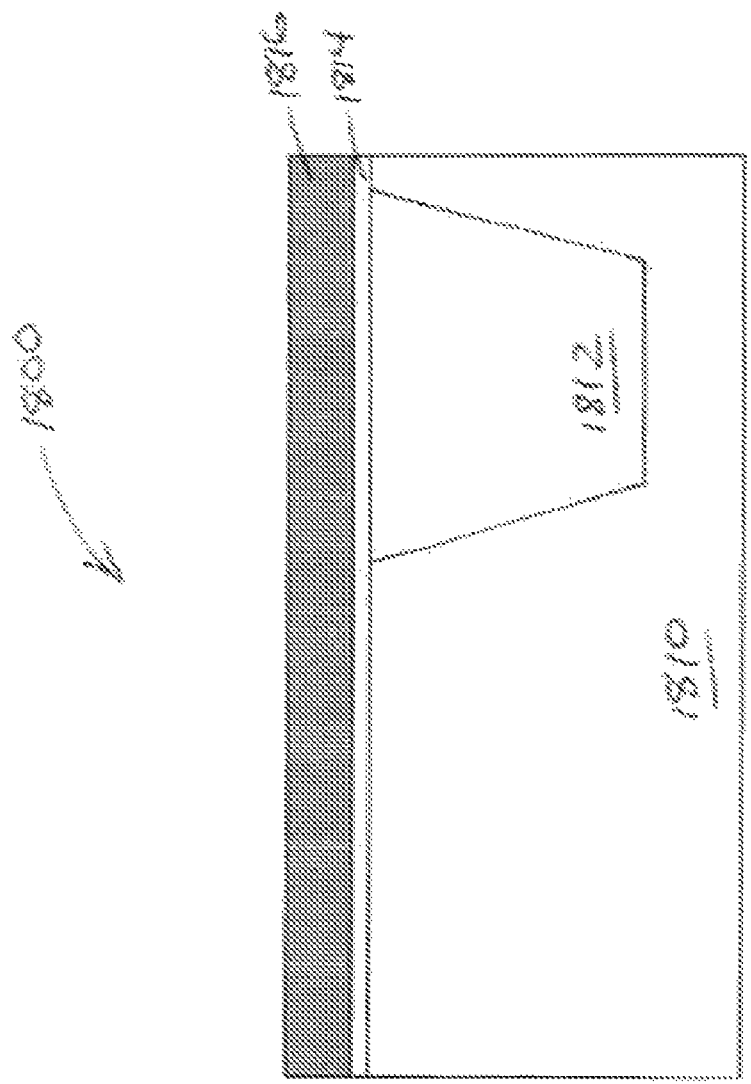
FIG. 18 shows a schematic vertical side view of an eFUSE structure after Poly-Si deposition in accordance with an exemplary embodiment of the present disclosure.

Turning now to FIG. 18, an exemplary embodiment eFUSE structure after Poly-Si deposition is indicated generally by the reference numeral 1800. The structure 1800 is similar to the structure 1700 of FIG. 17, so duplicate description may be omitted. Here, a Poly-Si layer 1816 is disposed over the oxidation layer 1814.

Figure 19:
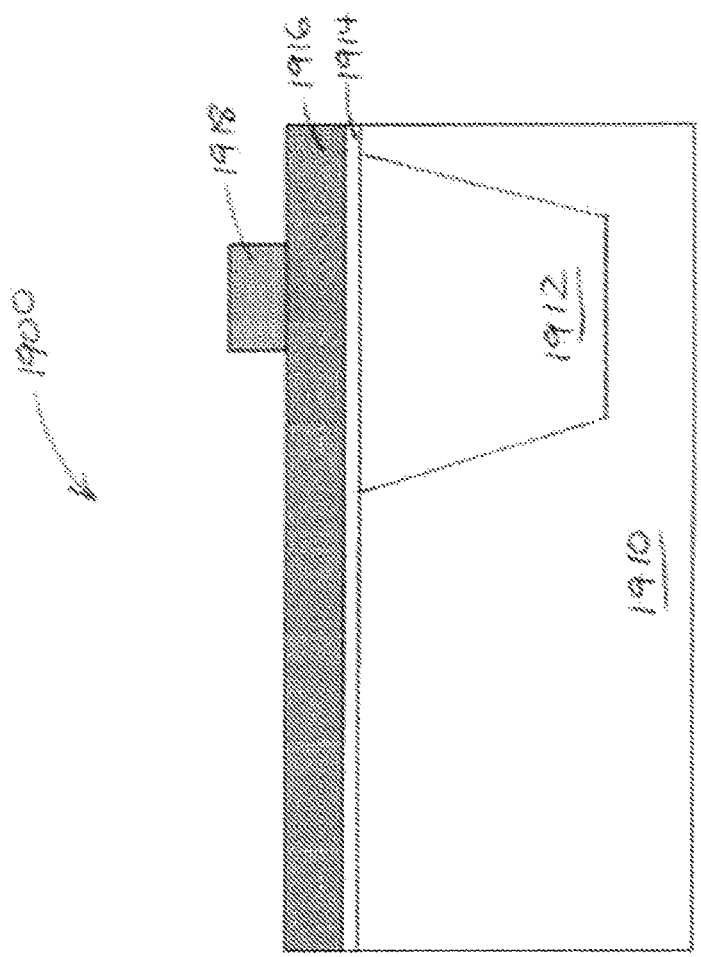
FIG. 19 shows a schematic vertical side view of an eFUSE structure after eFUSE PC patterning in accordance with an exemplary embodiment of the present disclosure.

As shown in FIG. 19, an exemplary embodiment eFUSE structure after eFUSE PC patterning is indicated generally by the reference numeral 1900. The structure 1900 is similar to the structure 1800 of FIG. 18, so duplicate description may be omitted. Here, a photo-resist (PR) pattern 1918 is disposed on the Poly-Si layer 1916.

Figure 20:
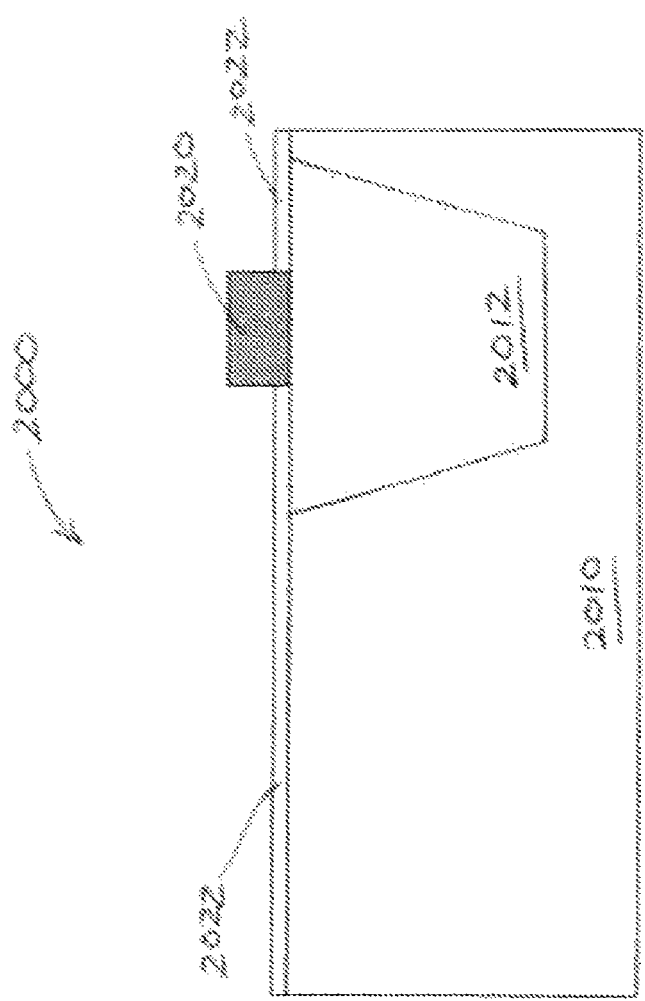
FIG. 20 shows a schematic vertical side view of an eFUSE structure after eFUSE PC etching in accordance with an exemplary embodiment of the present disclosure.

Turning to FIG. 20, an exemplary embodiment eFUSE structure after eFUSE PC etching is indicated generally by the reference numeral 2000. The structure 2000 is similar to the structure 1900 of FIG. 19, so duplicate description may be omitted. After etching, a polyconductor (PC) 2020 portion of the former Poly-Si layer is disposed on the STI 2012, and a residual layer 2022 is disposed over the remainder of the STI 2012 and substrate 2010.

Figure 21:
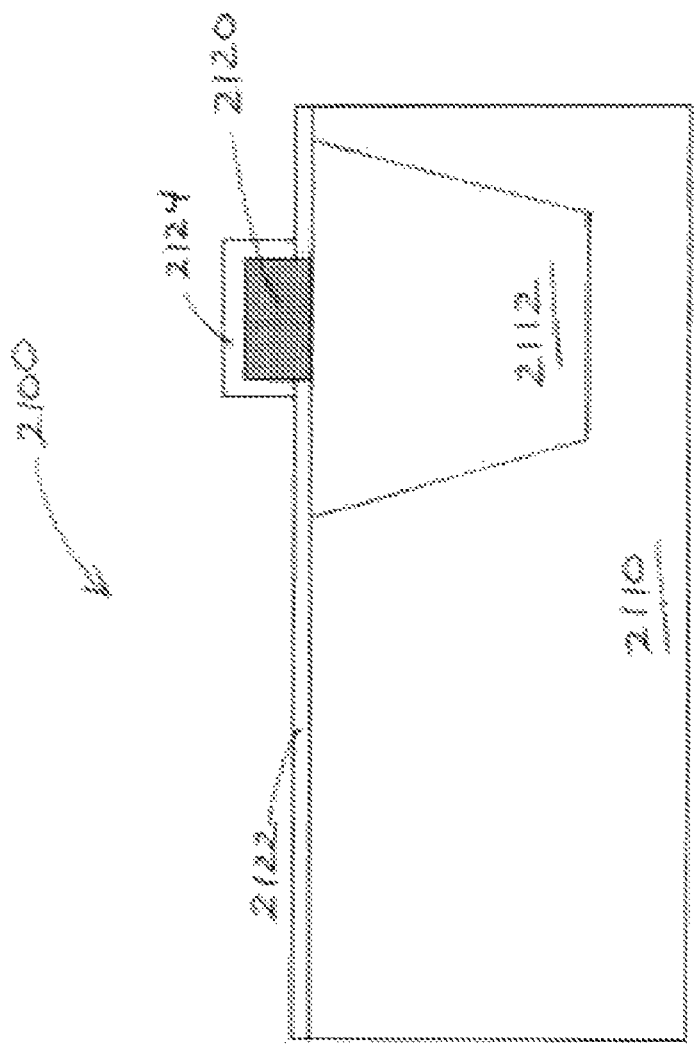
FIG. 21 shows a schematic vertical side view of an eFUSE structure after DG and EG oxidation in accordance with an exemplary embodiment of the present disclosure.

Turning now to FIG. 21, an exemplary embodiment eFUSE structure after DG and EG oxidation is indicated generally by the reference numeral 2100. The structure 2100 is similar to the structure 2000 of FIG. 20, so duplicate description may be omitted. Here, an EG oxide 2122 is disposed over the exposed portion of the STI 2112 and the substrate 2110, and a DG oxide 2124 is disposed over the PC 2120.

Figure 22:
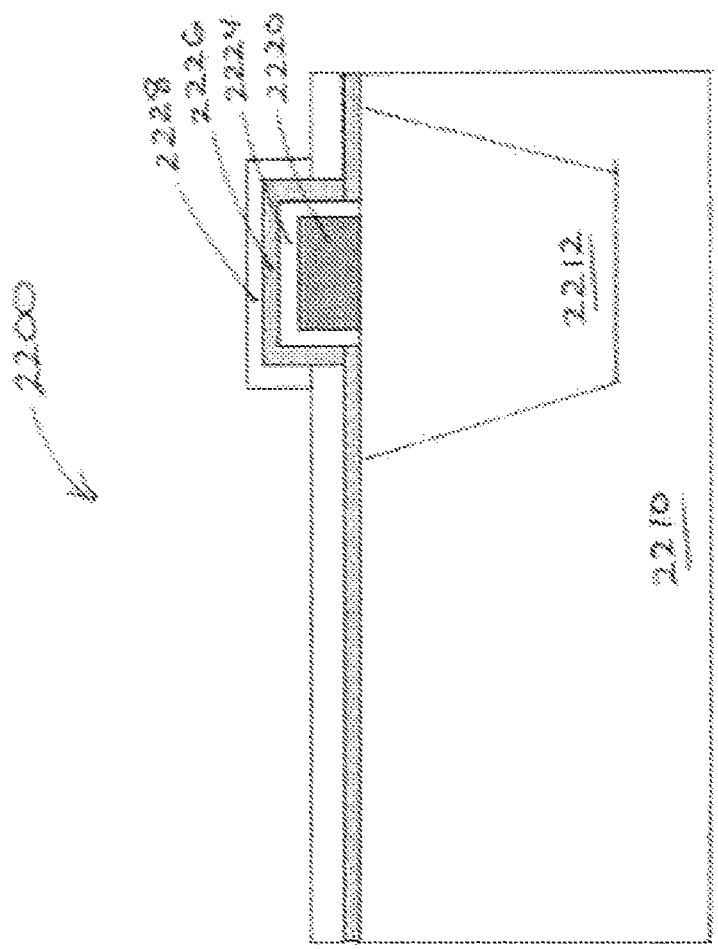
FIG. 22 shows a schematic vertical side view of an eFUSE structure after HfO2 and TiN deposition in accordance with an exemplary embodiment of the present disclosure.

As shown in FIG. 22, an exemplary embodiment eFUSE structure after HfO2 and TiN deposition is indicated generally by the reference numeral 2200. The structure 2200 is similar to the structure 2100 of FIG. 21, so duplicate description may be omitted. Here, a Hafnium Oxide (HfO2) layer 2226 is disposed over the exposed portion of the STI 2212 and the substrate 2210, and over the DG oxide 2224 on the PC 2220. In addition, a Titanium Nitride (TiN) layer 2228 is disposed over the HfO2 layer. The thickness of the TiN 2228 substantially above the PC 2220 and DG 2224 may be thinner than the thickness of the TiN elsewhere. For example, the thickness of the TiN 2228 substantially above the PC 2220, plus the thickness of the DG 2224 above the PC 2220, may approximate the thickness of the TiN elsewhere.

Figure 23:
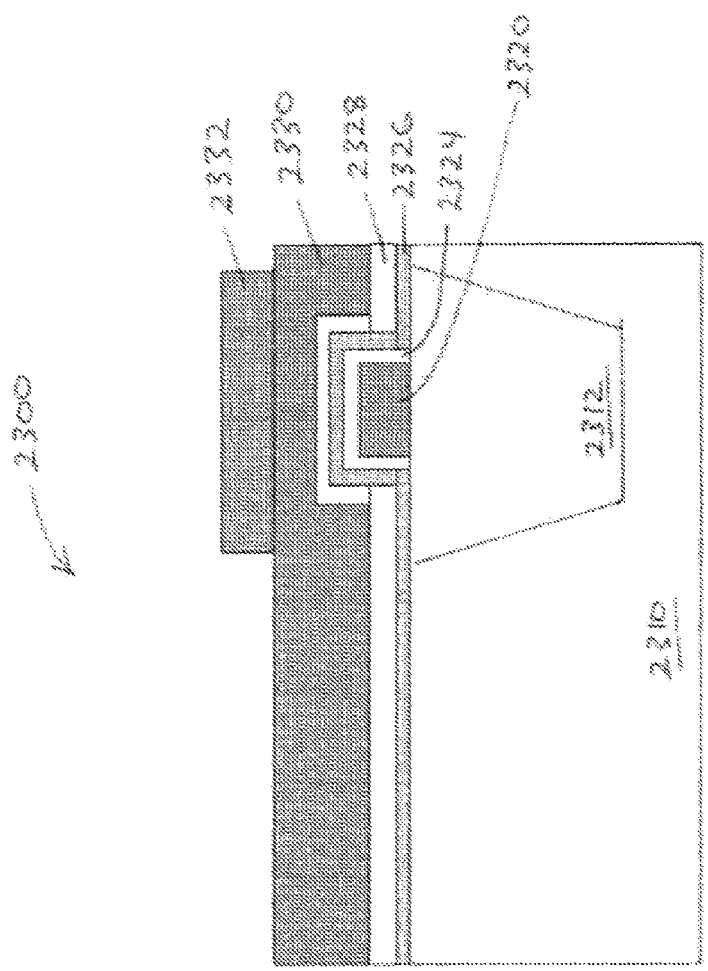
FIG. 23 shows a schematic vertical side view of an eFUSE structure after Gate Poly-Si deposition in accordance with an exemplary embodiment of the present disclosure.

Turning to FIG. 23, an exemplary embodiment eFUSE structure after Gate Poly-Si deposition is indicated generally by the reference numeral 2300. The structure 2300 is similar to the structure 2200 of FIG. 22, so duplicate description may be omitted. Here, a level Poly-Si layer 2330 is disposed over the TiN layer 2328, and a gate Poly-Si layer 2332 is disposed on the Poly-Si 2330 substantially over the STI 2312. The thickness of the level Poly-Si 2330 substantially above the PC 2320 may be thinner than the thickness of the level Poly-Si elsewhere. For example, the thickness of the level Poly-Si 2330 that is substantially above the PC 2320, plus the thickness of the gate Poly-Si 2332 above the PC 2320, may approximate the thickness of the level Poly-Si 2330 elsewhere. Thus, the additional gate Poly-Si 2332 may be used to control the etch down to the PC 2320 while substantially preventing oxide damage thereon.

Figure 24:
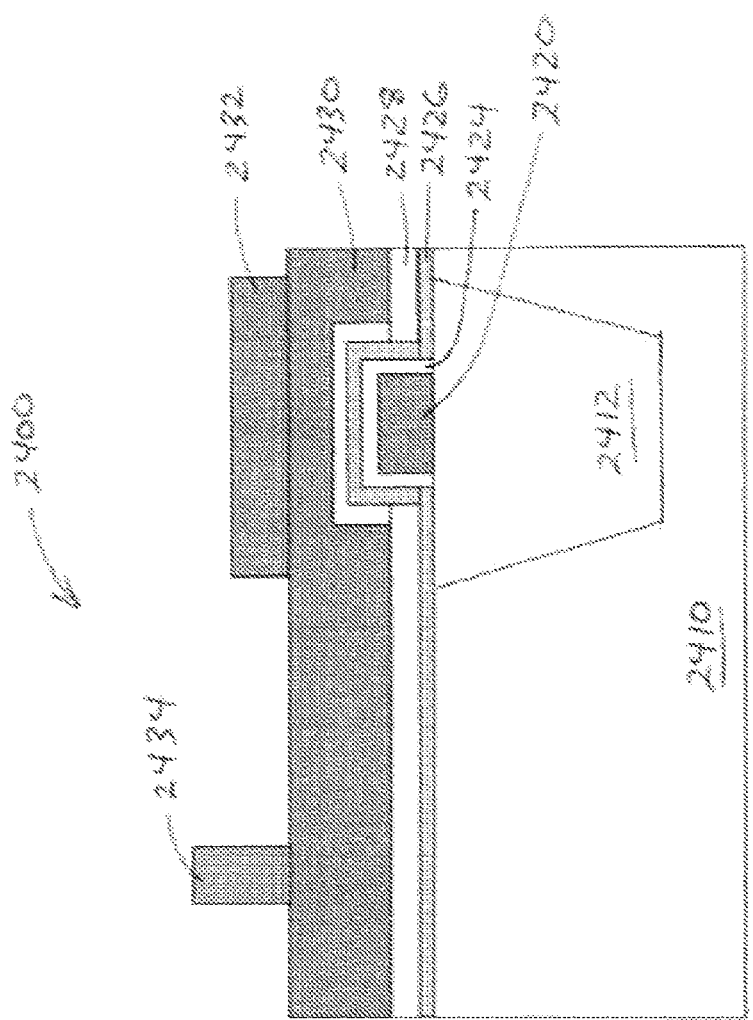
FIG. 24 shows a schematic vertical side view of an eFUSE structure after Gate patterning in accordance with an exemplary embodiment of the present disclosure.

Turning now to FIG. 24, an exemplary eFUSE structure after Gate patterning is indicated generally by the reference numeral 2400. The structure 2400 is similar to the structure 2300 of FIG. 23, so duplicate description may be omitted. Here, a photo-resist (PR) mask 2434 is disposed on the Poly-Si layer 2430 substantially towards the end of the elongated substrate without STI thereon.

Figure 25:
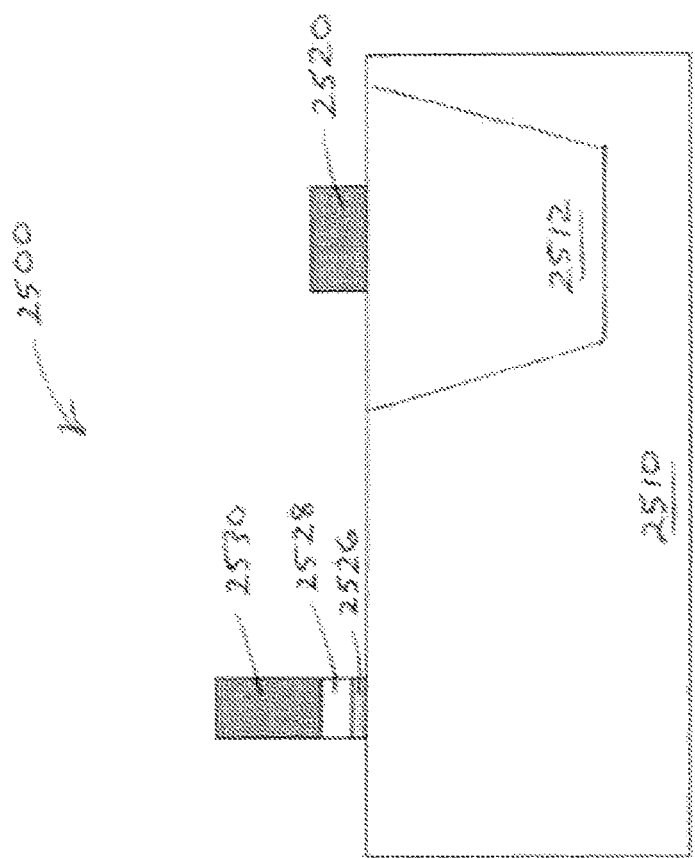
FIG. 25 shows a schematic vertical side view of an eFUSE structure after Gate PC etch in accordance with an exemplary embodiment of the present disclosure.

As shown in FIG. 25, an exemplary embodiment eFUSE structure after Gate PC etch is indicated generally by the reference numeral 2500. The structure 2500 is similar to the structure 2400 of FIG. 24, so duplicate description may be omitted. After etching, the PC 2520 remains on the STI 2512, while a columnar stack of the HfO2 2526, TiN 2528 and Poly-Si 2530 remains on the substrate 2510.

Figure 26:
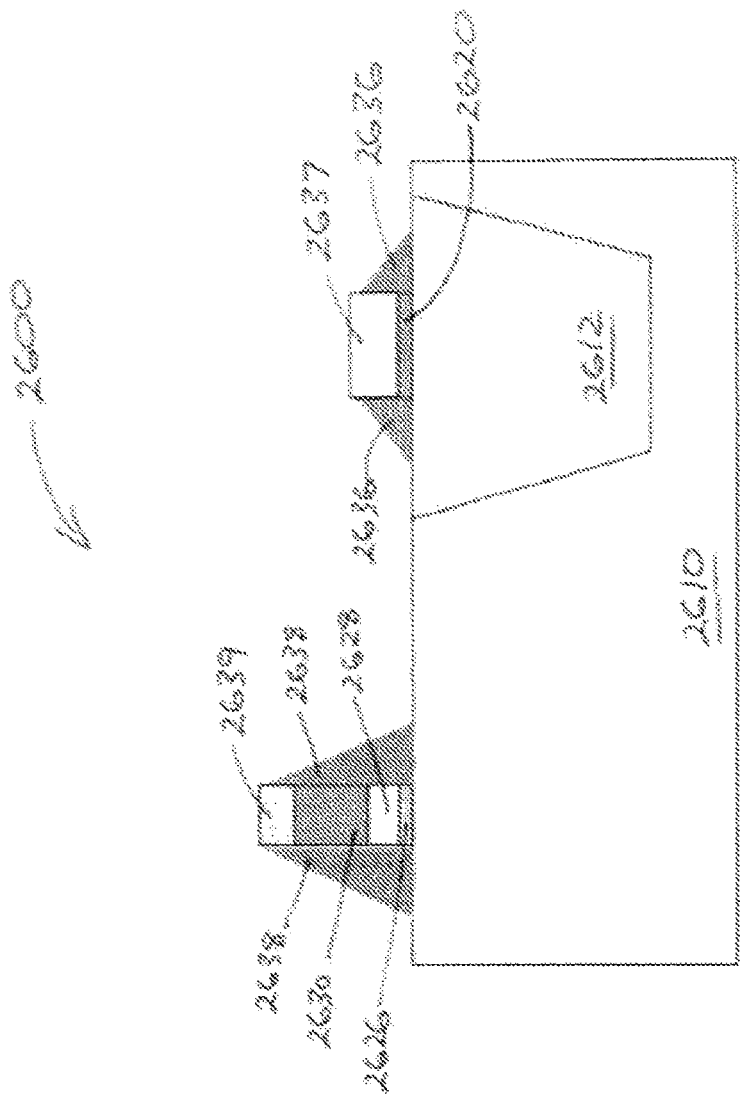
FIG. 26 shows a schematic vertical side view of an eFUSE structure after Silicide and spacer formation in accordance with an exemplary embodiment of the present disclosure.

Turning to FIG. 26, an exemplary embodiment eFUSE structure after Silicide and spacer formation is indicated generally by the reference numeral 2600. The structure 2600 is similar to the structure 2500 of FIG. 25, so duplicate description may be omitted. Here, a first silicide 2637 is disposed on the PC 2620, and a second silicide 2639 is disposed on the Poly-Si 2630. A first spacer 2636 is disposed on the STI 2612 around a columnar stack of the PC 2620 and the first silicide 2637, and a second spacer 2638 is disposed on the substrate 2610 around the columnar stack of the HfO2 2626, TiN 2628, Poly-Si 2630 and second silicide 2639.

Figure 27:
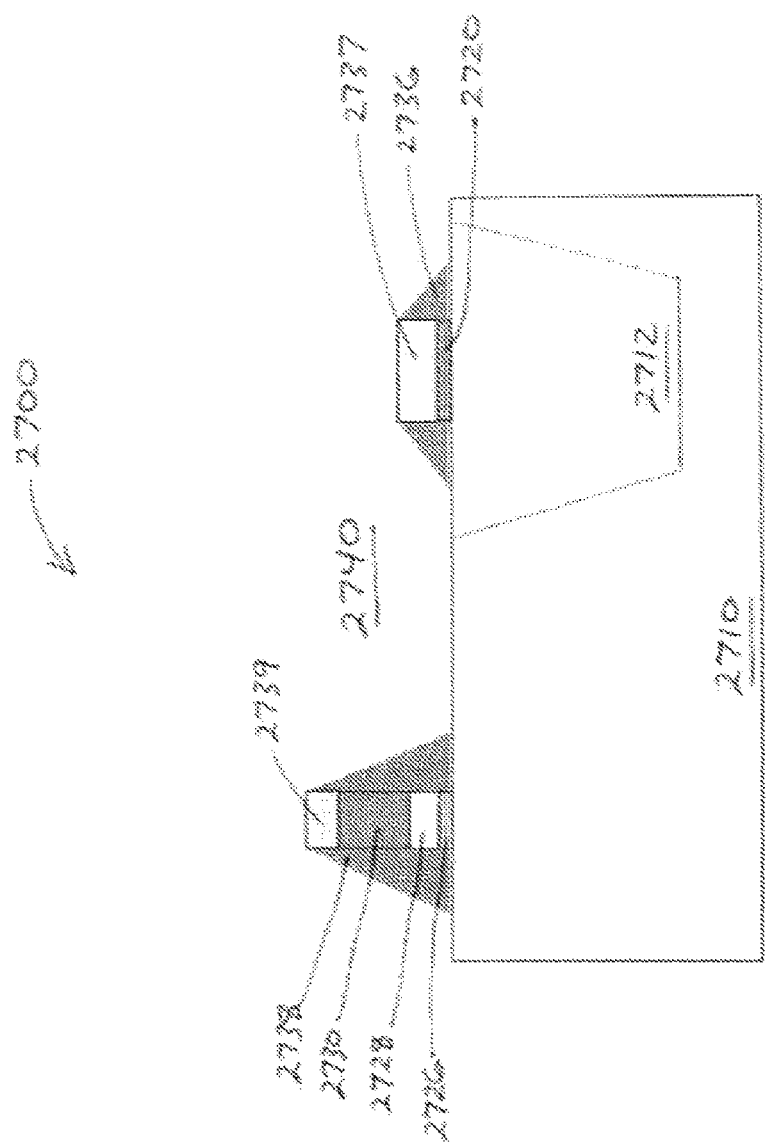
FIG. 27 shows a schematic vertical side view of an eFUSE final structure in accordance with an exemplary embodiment of the present disclosure.

Turning now to FIG. 27, an exemplary embodiment eFUSE final structure is indicated generally by the reference numeral 2700. The structure 2700 is similar to the structure 2600 of FIG. 26, so duplicate description may be omitted. Here, a leveling top insulator 2740 is disposed over the substrate 2710, second spacer 2738, second silicide 2739, first spacer 2736 and first silicide 2737. Thus, the insulated first silicide 2737 on the PC 2720 with first spacer 2736 forms an eFUSE. Simultaneously, the insulated columnar stack of second silicide 2739, Poly-Si 2730, TiN 2728, and HfO2 2726, with second spacer 2738, forms a transistor.

In method embodiments of the present disclosure, High-K and metal (e.g., TiN) materials are removed naturally at the same time as the gate formation step. In addition, alternate embodiments are contemplated. For example, the resistance R of the resulting embedded resistors may be easily adjusted by changing the thickness of the Poly-Silicon layers. Moreover, the Poly-Si itself may be replaced with comparable materials, such as single crystal silicon, or amorphous silicon (a-Si) with or without local crystallization.

Thus, method embodiments of the present disclosure may form an embedded resistor using just one more photo step in addition to the steps already performed to form a transistor. In contrast, prior methods used at least two additional steps; one for OP resistor patterning, and another to strip away metal.

The use of eFUSEs permits dynamic real-time reprogramming of logic chips. For example, computer logic is etched onto a chip, and generally cannot be changed after the chip has been manufactured. By utilizing eFUSEs, the circuits on a chip may be changed while the chip is in operation. Thus, eFUSEs may provide in-chip performance tuning. For example, if certain sub-systems fail, take too long to respond, or consume too much power, the chip logic behavior can be instantly changed by intentionally blowing one or more eFUSEs. This process does not physically destroy the eFUSE, so it is reversible and repeatable, such as by using Joint Test Action Group (JTAG) programming. JTAG, or IEEE Standard 1149.1, is a standard that specifies how to control and monitor the pins of compliant devices on a printed circuit board.

Although illustrative embodiments have been described herein with reference to the accompanying drawings, it is to be understood that the present disclosure is not limited to those precise embodiments, and that various other changes and modifications may be effected therein by those of ordinary skill in the pertinent art without departing from the scope or spirit of the present disclosure. such changes and modifications are intended to be included within the scope of the present disclosure as set forth in the appended claims.

What is claimed is:

1. A method for generating an embedded resistor in a semiconductor device, the method comprising:
   forming a shallow trench isolation (STI) region in a substrate;
   forming a pad oxide on the STI region and substrate;
   depositing a first silicon layer on the pad oxide;
   forming a photo-resist mask on a portion of the first silicon layer disposed substantially above the STI region;
   etching the first silicon layer to yield a polyconductor (PC) disposed substantially above the STI region;
   oxidizing the PC;

depositing at least one of an oxide material or a metal gate material on the oxidized surface;

depositing a second silicon layer on the at least one oxide material or metal gate material;

depositing additional silicon on a portion of the second silicon layer disposed substantially above the STI region;

patterning a transistor gate with a photo-resist mask disposed on another portion of the second silicon layer disposed substantially away from the STI region; and etching the second silicon layer to yield at least one transistor structure disposed substantially away from the STI region and at least one resistor structure disposed substantially above the STI region.

2. The method of claim 1, further comprising forming a silicide portion on at least one of the transistor or resistor structures.

3. The method of claim 2 wherein the at least one of the transistor or resistor structures with silicide forms an eFUSE.

4. The method of claim 1, further comprising forming at least one spacer around each of the transistor and resistor structures.

5. The method of claim 4 wherein the at least one spacer is disposed directly on the substrate.

6. The method of claim 4 wherein the at least one spacer comprises an insulating material.

7. The method of claim 1, further comprising forming an insulating layer above the transistor and resistor structures.

8. The method of claim 1 wherein the step of forming a photo-resist mask on a portion of the first silicon layer disposed substantially above the STI region is the only photo step added for forming a resistor structure.

9. The method of claim 1 wherein the final resistance of the resistor structure is adjusted by changing the thickness of the first silicon layer.

10. The method of claim 1 wherein an isolation area is defined by using the STI formation process.

11. The method of claim 1, further comprising performing well ion-implantation (IIP) in the same step where the pad oxide is formed with oxidation.

12. The method of claim 11 wherein the IIP is applied to a channel using a Vt Taylor process.

13. The method of claim 1 wherein the thickness of the first silicon layer is between about 0 Angstroms and about 2000 Angstroms.

14. The method of claim 1, further comprising planarizing the STI region and substrate prior to forming the pad oxide.

15. The method of claim 1 wherein oxidizing the PC comprises at least one of processing with single-gate (SG) oxide, extended-gate (EG) oxide, dual-gate (DG) oxide, triple-gate (TG) oxide, quadruple or higher number of oxides.

16. The method of claim 1 wherein depositing at least one of an oxide material or a metal gate material on the oxidized surface comprises depositing a High-K material and a metal gate material.

17. The method of claim 16 wherein the High-K material comprises at least one of HfO2, AlO, ZrO2, TiO2, or like materials.

18. The method of claim 1 wherein depositing at least one of an oxide material or a metal gate material on the oxidized surface comprises depositing an oxide material and a metal gate material.

19. The method of claim 18 wherein the oxide material comprises at least one of SiO2, SiON, DPN oxide, RPN oxide, or like materials.

20. The method of claim 1 wherein the metal gate material comprises TiN or like materials.

21. The method of claim 1 wherein the silicon comprises Polycrystalline Silicon (Poly-Si).

* * * * *